US010372178B2

(12) United States Patent
Chang et al.

(10) Patent No.: US 10,372,178 B2
(45) Date of Patent: Aug. 6, 2019

(54) FLEXIBLE HOT PLUG FAN MODULE SYSTEM

(71) Applicant: QUANTA COMPUTER INC., Taoyuan (TW)

(72) Inventors: Hou-Hsien Chang, Taoyuan (TW); Chao-Jung Chen, Taoyuan (TW); Yaw-Tzorng Tsorng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/697,292

(22) Filed: Sep. 6, 2017

(65) Prior Publication Data

US 2019/0073006 A1 Mar. 7, 2019

(51) Int. Cl.
*G06F 1/20* (2006.01)
*H05K 7/14* (2006.01)
(Continued)

(52) U.S. Cl.
CPC ............. *G06F 1/206* (2013.01); *G06F 1/26* (2013.01); *H05K 7/1488* (2013.01); *H05K 7/20709* (2013.01); *H05K 7/20727* (2013.01)

(58) Field of Classification Search
CPC ......... H01L 2924/0002; H01L 2924/00; H01L 23/467; H01L 2224/97; H01L 2924/15311; H01L 23/427; G06F 1/20; G06F 1/203; G06F 1/206; G06F 1/16; G06F 1/181; G06F 1/183; G06F 1/26; H05K 7/20172; H05K 7/20727; H05K 7/20836; H05K 7/20581; H05K 7/20736; H05K 7/2019;
(Continued)

(56) References Cited

U.S. PATENT DOCUMENTS 5,412,534 A * 5/1995 Cutts .................... G11B 33/142
361/679.46
6,222,736 B1 * 4/2001 Sim ........................ G06F 1/184
361/727
(Continued)

FOREIGN PATENT DOCUMENTS

CN 205540470 U 8/2016
JP 2008016657 A 1/2008
(Continued)

OTHER PUBLICATIONS

Extended European Search Report for EP Application No. 18167240.3, dated Nov. 9, 2018.
(Continued)

*Primary Examiner* — Adam B Dravininkas
(74) *Attorney, Agent, or Firm* — Nixon Peabody LLP; Zhou Lu

(57) ABSTRACT

A system of modular fans for a network device is disclosed. The network device includes a rack assembly having side walls forming an enclosure with a plurality of sled slots accessible from a rear end. A plurality of operation sleds are mountable on one of the plurality of sled slots. A plurality of removable fan modules is provided. Each of the removable fan modules are installed in one of the operation sleds. The removable fan modules are individually removable from the operation sleds and therefore may be swapped out while the rest of the components in the network device remain operational.

13 Claims, 5 Drawing Sheets

(51) Int. Cl.
*H05K 7/20* (2006.01)
*G06F 1/26* (2006.01)

(58) Field of Classification Search
CPC .......... H05K 7/20745; H05K 7/20209; H05K 7/20145; H05K 7/20572; H05K 7/20181; H05K 7/20718; H05K 7/1488; H05K 7/20709

See application file for complete search history.

(56) References Cited

U.S. PATENT DOCUMENTS

| | | | | |
|---|---|---|---|---|
| 6,316,718 | B1* | 11/2001 | Lin | H05K 7/20172 |
| | | | | 174/17 VA |
| 6,592,327 | B2* | 7/2003 | Chen | F04D 25/166 |
| | | | | 415/213.1 |
| 6,621,693 | B1* | 9/2003 | Potter | G06F 1/184 |
| | | | | 257/E23.099 |
| 8,520,385 | B2* | 8/2013 | Chen | H05K 7/1488 |
| | | | | 165/104.33 |
| 9,521,784 | B1* | 12/2016 | Huang | H05K 7/20172 |
| 9,839,164 | B2* | 12/2017 | Shelnutt | H05K 7/20772 |
| 2003/0112601 | A1* | 6/2003 | Smith | G06F 1/183 |
| | | | | 361/695 |
| 2003/0117782 | A1 | 6/2003 | Wrycraft et al. | |
| 2005/0105269 | A1* | 5/2005 | Chen | H05K 7/20172 |
| | | | | 361/695 |
| 2005/0227608 | A1* | 10/2005 | Wu | G06F 1/20 |
| | | | | 454/184 |
| 2006/0154593 | A1 | 7/2006 | Lin et al. | |
| 2007/0035924 | A1* | 2/2007 | Westphall | G06F 1/183 |
| | | | | 361/679.48 |
| 2009/0009961 | A1* | 1/2009 | Li | G06F 1/20 |
| | | | | 361/679.48 |
| 2011/0116233 | A1* | 5/2011 | Beaudoin | H05K 7/20581 |
| | | | | 361/695 |
| 2011/0157815 | A1 | 6/2011 | Lin | |
| 2012/0328449 | A1 | 12/2012 | Kia et al. | |
| 2015/0208548 | A1* | 7/2015 | Chu | H05K 7/20172 |
| | | | | 361/695 |
| 2016/0053776 | A1* | 2/2016 | Williams | H05K 7/20136 |
| | | | | 361/695 |
| 2017/0332519 | A1* | 11/2017 | Schmidtke | H05K 7/20736 |

FOREIGN PATENT DOCUMENTS

| | | |
|---|---|---|
| JP | 2009105256 A | 5/2009 |
| JP | 2015088672 A | 5/2015 |
| TW | 568298 U | 12/2003 |

OTHER PUBLICATIONS

TW Office Action for Application No. 107103514, dated Nov. 5, 2018, w/ First Office Action Summary.
TW Search Report for Application No. 107103514, dated Nov. 5, 2018, w/ First Office Action.
JP Office Action for Application No. 2018-078822, dated Mar. 12, 2019, w/ First Office Action Summary.

* cited by examiner

FLEXIBLE HOT PLUG FAN MODULE SYSTEM

TECHNICAL FIELD

The present disclosure relates generally to a fan system for a modular component electronic device. More particularly, aspects of this disclosure relate to using modular fans in an electronic device that utilize operation sleds for the swapping of modular fans while maintaining device operation.

BACKGROUND

Distributed network systems have been widely adopted with the emergence of the cloud for computing applications. Network systems encompass numerous connected devices including servers, switches and other components. Traditionally, such devices have a number of fixed circuit boards, as well as other components such as cooling systems and power systems. However, the demand for flexibility as well as the need for upgrading components has increased as the use of network systems has increased. Recently, network devices have been based on a modular design having a chassis such as a rack assembly. The rack assembly includes certain components such as controllers, data and power interfaces. The rack assembly also includes slots for the installation of replaceable operation sleds that contain hardware components that may be connected to the rack assembly. The benefit is that the individual operation sleds with hardware components may be replaced or maintained without discarding other components of the network device. Network administrators benefit from the greater flexibility as they may upgrade or alter hardware without having to replace entire devices.

The hardware components in network devices generate heat during their operation, thereby requiring fan systems to cool the components during their operation. In the more modular devices, the operation sleds are inserted in slots that are held by the rack assembly. A central fan system such as a fan wall is installed on one end of the rack assembly to cool all of the sleds installed in the assembly. However, to replace or access an individual operation sled, the entire device must be powered down since the fan system must be removed to access the operation sleds. The fans cannot function when an individual sled is removed. Operating the device without the fan wall in place would result in overheating the components on the rest of the sleds.

FIG. 1 shows a typical prior art network computing device 10 such as a network switch that has a rack assembly 12 having a back side 14. The rack assembly 12 has side walls 16 and 18 and is enclosed by a front assembly 20 that holds line cards, fabric cards and other electronic switching equipment. The back side 14 is generally open to allow the mounting of multiple operation sleds such as operation sleds 22, 24, 26 and 28 held by the side walls 16 and 18. Each of the sleds 22, 24, 26 and 28 include various components such as boards including hardware such as processing cores and memory that are connected to the line cards and fabric cards on the front assembly 20. The heat generated from the components on the boards in each of the sleds 22, 24, 26 and 28 and the front assembly 20 is cooled by a fan wall 30 that holds a number of fans in proximity to the sleds 22, 24, 26 and 28. Typically, the fan wall 30 is mounted on the back side 14 of the device 10 after the operation sleds 22, 24, 26 and 28 are placed in the rack assembly 12.

The fan wall 30 is located in proximity to the inserted operation sleds 22, 24, 26 and 28 in order to provide a direct outlet for the hot air generated from the operation of the hardware components on each of the sleds 22, 24, 26 and 28. The fans in the fan wall 30 circulate this air out the back side 14 of the device 10. In order to replace or repair the sleds 22, 24, 26, 28 from the back of the rack assembly 12, the fan wall 30 must first be removed so an individual sled may be removed from the rack assembly 12. Since the fan wall 30 is thus rendered inoperative, the rest of the sleds cannot be operated during the removal of an individual sled. Thus, the operation of the device 10 must be interrupted to replace or maintain an individual sled.

Thus, there is a need for a system that includes a modular fan system that allows the operation of multiple sleds when a single sled is replaced. There is also a need for a modular fan system that allows the cooling of different components by allowing the removal of only one set of fans. There is a further need for fan modules that are individually attachable to and removable from operation sleds.

SUMMARY

One disclosed example is a network device that includes a rack assembly having side walls forming an enclosure with a plurality of sled slots accessible from a rear end. The device includes a plurality of operation sleds. Each of the operation sleds is mountable on one of the plurality of sled slots. A plurality of removable fan modules are each installed in one of the operation sleds.

Another example is an operation sled that is removable from an assembly rack of a network device. The operation sled includes a casing having side walls defining a front section and a rear section. A circuit board is located in the rear section. A fan mounting bay is located in the front section. A removable fan module is inserted in the fan mounting bay. The removable fan module includes a motor and a fan.

Another example is a modular device for different electronic components. The modular device includes a rack assembly having side walls and a front panel forming an enclosure with a plurality of sled slots accessible from a rear end opposite the front panel. The device includes a plurality of operation sleds. Each of the operation sleds is mountable on one of the plurality of sled slots. A plurality of removable fan modules are each installed in one of the operation sleds.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1:
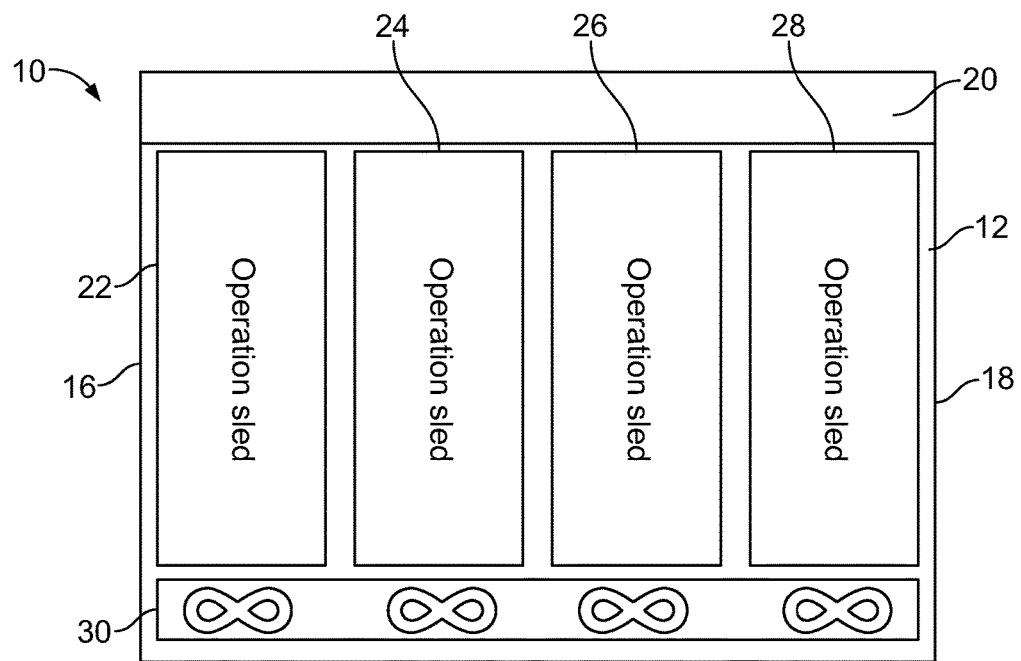
FIG. 1 is a prior art system including operation sleds and a fan wall for cooling the operation sleds.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail, with the understanding that the present disclosure is an example or illustration of the principles of the present disclosure and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed: the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

Figure 2:
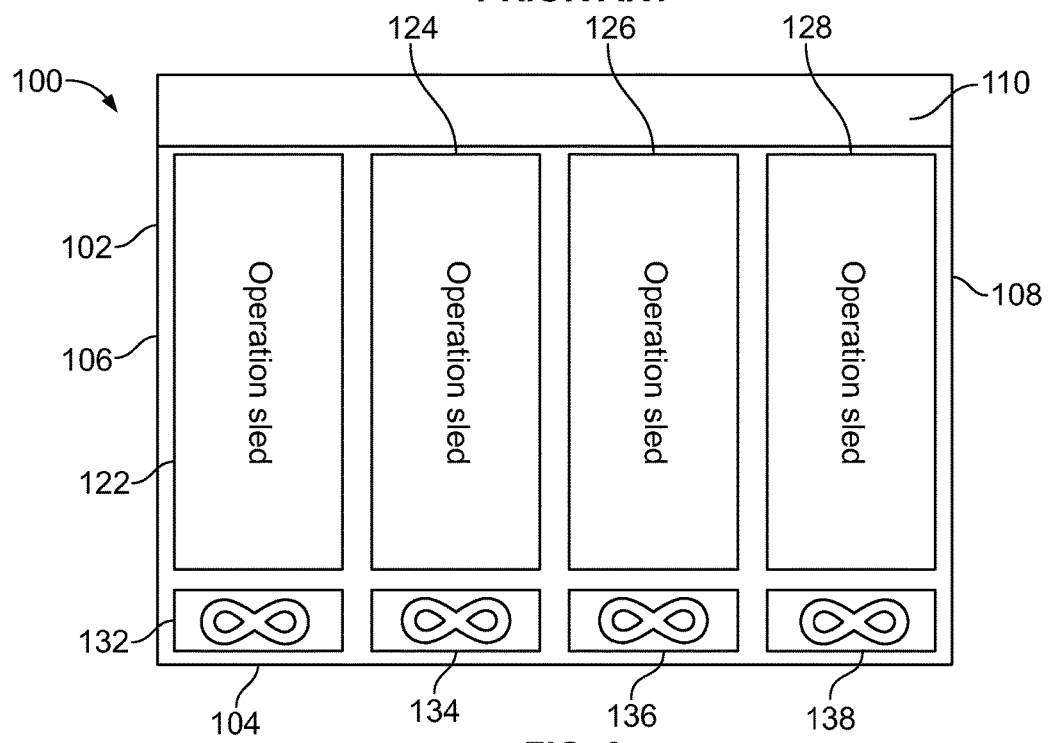
FIG. 2 is a block diagram of a network device having multiple operation sleds and corresponding fan modules.

FIG. 2 shows an example network device 100 that may be configured using different hardware in replaceable operation sleds. In this example, the network device 100 is a network switch with fabric cards and network cards for connection to network nodes. In FIG. 2, the device 100 includes a rack assembly 102 that includes a back side 104, and two side walls 106 and 108. A front assembly 110 holds line cards and fabric cards and a fixed front panel (not shown) that includes connection ports for cables from network nodes and other network devices. Due to the hardware in the front assembly 110 and the need to continually connect and disconnect cables, the front assembly 110 is permanently attached to the side walls 106 and 108. Thus, the front assembly 110 in conjunction with the side walls 106 and 108 form an enclosure that defines the rack assembly 102.

The rack assembly 102 includes components such as network interface circuits, power interface circuits, block controllers, and the like on a baseboard or backplane. The rack assembly 102 in this example holds four operation sleds 122, 124, 126 and 128 in the enclosure formed by the front assembly 110 and the side walls 106 and 108. The operation sleds 122, 124, 126 and 128 may be rolled out from the rack assembly 102 individually and therefore be serviced or replaced. In this example, the operation sleds 122, 124, 126 and 128 hold various components such as processors, memory, and interface circuits that may be coupled to the line cards and fabric cards of the front assembly 110. The operation sleds 122, 124, 126 and 128 may be connected to the components of the rack assembly 102 to receive power and data signals.

A set of fan modules 132, 134, 136 and 138 are mounted on the respective operation sleds 122, 124, 126 and 128. The fan modules 132, 134, 136 and 138 may contain one or more fans powered by a motor and may cool the respective components on the operation sleds 122, 124, 126 and 128 through the back side 104. As explained below, each of the fan modules 132, 134, 136 and 138 are individually attached to a single operation sled. Therefore each operation sled 122, 124, 126 and 128 may be removed individually while the remainder of the operation sleds may continue to operate as they may be cooled by their respective fan modules. Further, the fan modules 132, 134, 136 and 138 each may be removed from their respective operation sled while the sled is still attached to the rack assembly 102.

Figure 3:
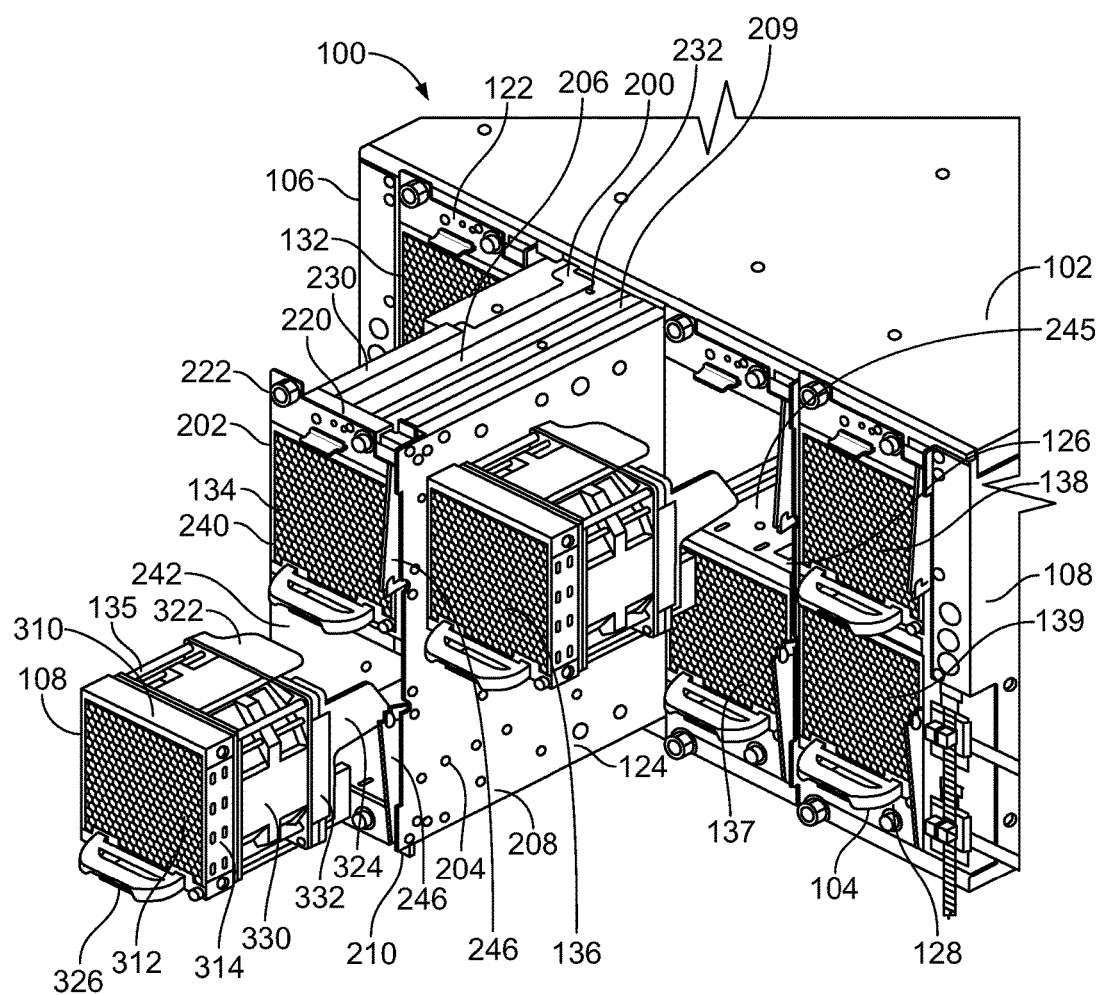
FIG. 3 is a perspective view of the removable fan modules and operational sleds of the network device in FIG. 2.

FIG. 3 is a perspective view of the network device 100 in FIG. 2. As shown in FIG. 3, the rack assembly 102 of the network device 100 mounts the operation sleds 122, 124, 126 and 128 between the side walls 106 and 108. The operation sleds 122, 124, 126 and 128 are installed and removed through the back side 104. As may be seen in FIG. 3, the operation sled 124 has been partially removed while the other operation sleds 122, 126 and 128 remain installed in rack assembly 102. As shown in FIG. 3, the operation sled 124 has been pulled out of the rack assembly 102 with the attached fan module 134 and another fan module 135 previously installed in the sled 124. In FIG. 3, the fan module 135 has been removed from the operation sled 124. In this example, each of the operation sleds 122, 124, 126 and 128 include two fan modules. For example the operation sled 136 holds fan modules 136 and 137 and the operation sled 125 holds fan modules 138 and 139. Each of the fan modules 132, 134, 135, 136, 137, 138 and 139 are identical and includes a fan propelled by an electric motor (not shown). The fan modules 132, 134, 135, 136, 137, 138 and 139 are each powered by power connections from the power circuit of the rack assembly 102. It is to be understood that although two fan modules are attached to each operation sled, each of the operation sleds may include multiple numbers of fan modules.

As may be seen by the removed operation sled 124 in FIG. 3, the sled 124 includes a rectangular casing 200. The casing 200 includes side walls 202 and 204, a top panel 206 and a bottom panel 208. The bottom panel 208 includes mounting components such as pins 210 that may mate with grooves (not shown) in the rack assembly 102 to allow the operation sled 124 to be rolled in and out of the rack assembly 102. The casing 200 contains one or more circuit boards (not shown) and connectors for power and electrical data signals from the rack assembly 102. The circuit boards may be attached to the side walls 202 and 204, the top panel 206 or the bottom panel 208. The top panel 206 includes a dynamic foolproof guide 209 that assists in positioning the operation sled 124. The operation sled 124 includes a connector panel 220 that includes external connection ports such as a USB port, Ethernet port, etc. to allow the external connection to components on the circuit boards in the operation sled 124. A rotatable captive screw 222 serves to lock the operation sled 124 to the rack assembly 102 when the operation sled 124 is fully inserted into the rack assembly 102 as shown by the operation sleds 122, 126 and 128 in FIG. 3. The casing 200 of the operation sled 124 includes a front portion 230 and a rear portion 232. The rear portion 232 holds the various circuit boards with the hardware components such as processors, memory, and other integrated circuits, as well as power and data interface components. The front portion 230 in this example includes two fan mounting bays 240 and 242 that each include supporting members for holding respective fan modules 134 and 135, in proximity to the circuit boards in the rear portion 232 of the casing 200. A fan partition 245 (shown in operation sled 126) separates the two fan modules. The fan mounting bays 240 and 242 both include locking levers 246 in contact with the removable fan modules 134 and 135. The locking levers 146 may be actuated between a first position to release the removable fan module from the mounting bay and a second position to hold the removable fan module in the mounting bay. For example, when the locking lever 146 is pivoted outward, the fan module is released from the fan mounting bay to allow the fan module to removed, as shown by the fan module 135 in FIG. 3. When a fan module is inserted in one of the fan mounting bays 240 and 242, the locking lever 246 is rotated toward the operation sled 124 to lock the fan module in place in the fan mounting bay.

Figure 4A:
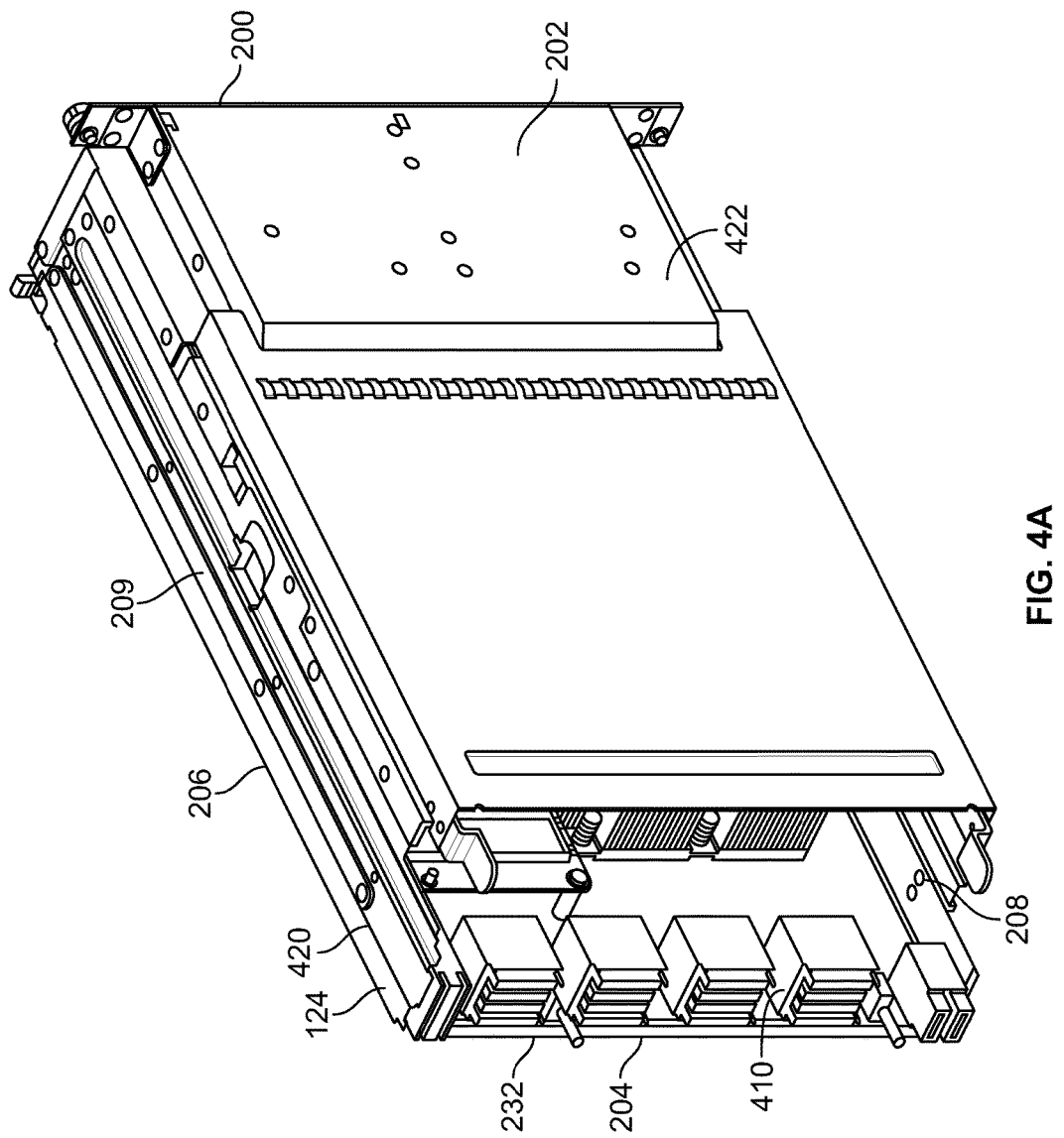
FIG. 4A is a perspective rear view of one of the operation sleds in FIG. 3.
Figure 4B:
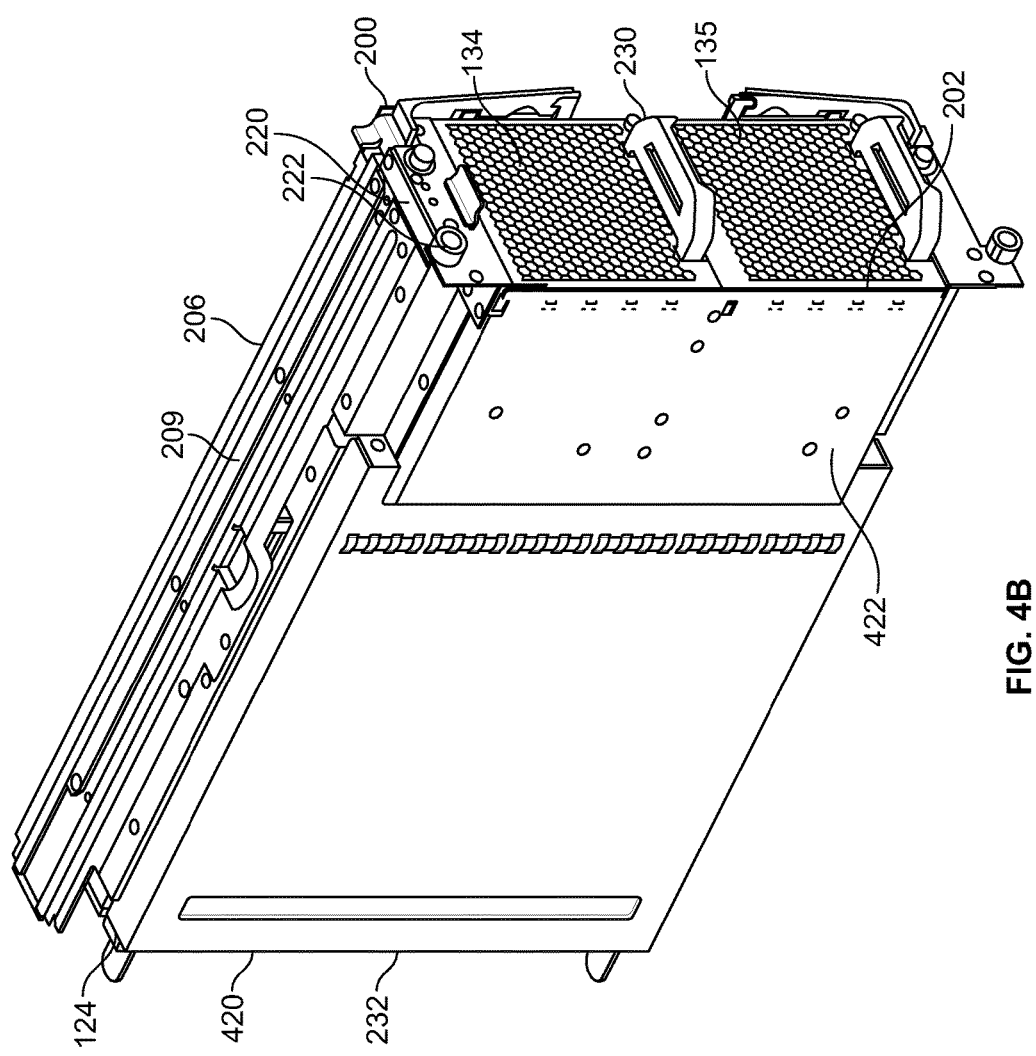
FIG. 4B is a perspective front view of the one of the operation sleds in FIG. 3.
Figure 4C:
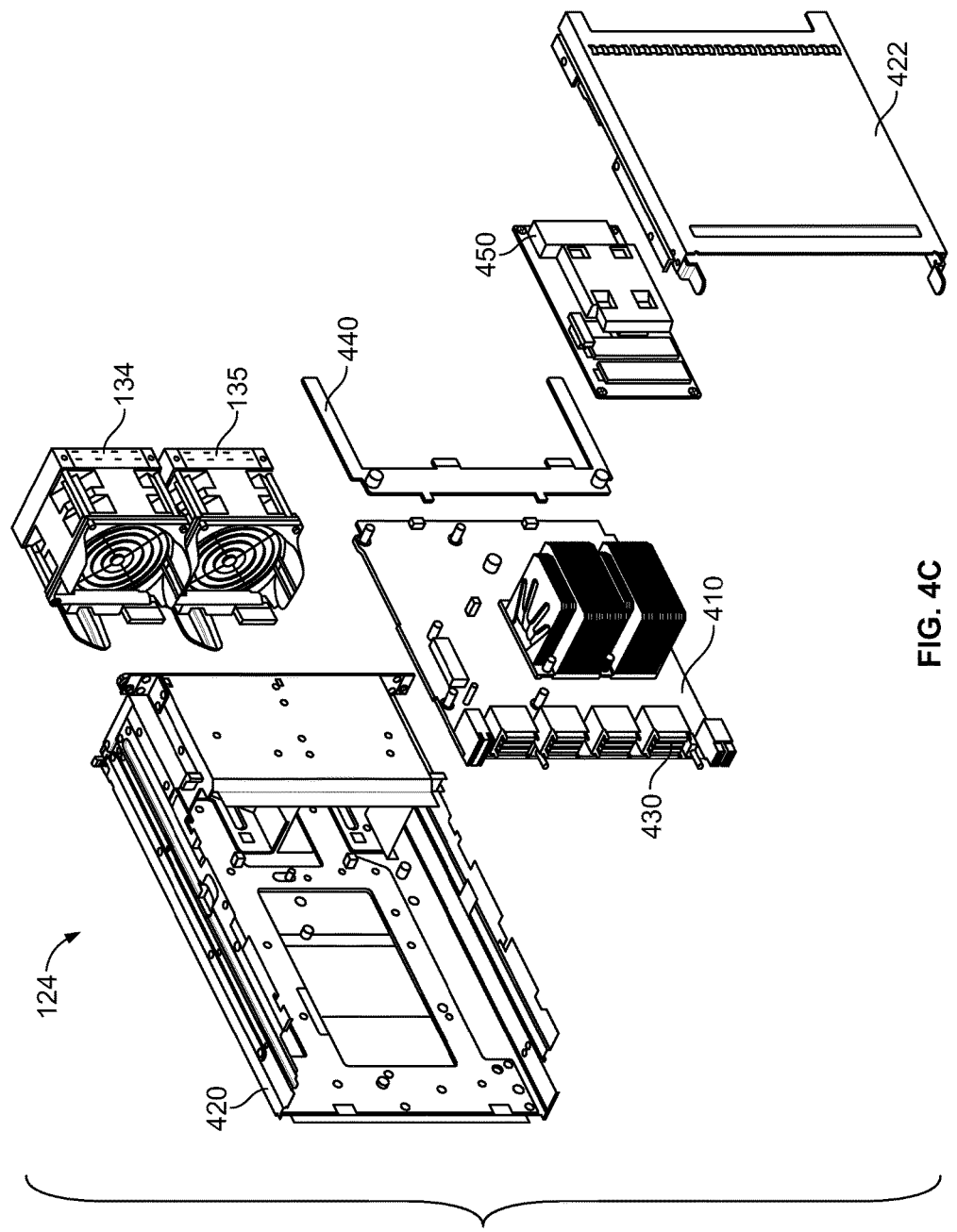
FIG. 4C is an exploded perspective view of the components of one of the operation sleds in FIG. 3.

FIG. 4A a perspective rear view and FIG. 4B is a perspective front view of the operation sled 124 in FIG. 3. FIG. 4C is an exploded perspective view of the components of the operation sled 124. In FIGS. 4A-4C, identical elements are labeled with identical element numbers in FIG. 3. In this example the operation sled 124 holds a fabric card 410 and associated electronics. It is to be understood that any other type of electronic components could be installed in the structure of the operation sled 124 and the fans 134 and 135.

As is shown in FIGS. 4A-4C, the casing 200 includes fabric card sled tray 420 that includes the side wall 204, the top panel 206 and the bottom panel 208. The sled tray 420 also includes part of the side wall 202. A fabric card sled cover 422 forms the rest of the side wall 202 and may be removed from the fabric card sled tray 420. As may be seen in FIG. 4C, the fabric card 410 includes various electronic components and connectors 430 that mate with corresponding connectors on the front assembly of the device 100 in FIG. 2. The casing 200 also holds a fan board 440 that has control components to control the operation of the fan modules 134 and 135. The fan modules 134 and 135 each include connectors to the fan board 440. The casing 200 also holds a CPU board 450 that manages operations of the components of the operation sled 124.

As shown in FIG. 3, each of the fan modules 132, 134, 135, 136, 137, 138 and 139 are identical and contain the same components. Each of the fan modules 132, 134, 135, 136, 137, 138 and 139 may be separately removed from their respective operation sleds and are interchangeable. The fan modules may be removed whether the operation sled is fully installed in the rack assembly 102 such as the operation sleds 122, 126 and 128 in FIG. 3, or when an operation sled is partially or fully removed such as the operation sled 124 in FIG. 3.

For example, the fan module 135 includes a front frame 310 that holds a grill 312 that allows hot air generated from the components on the operation sled 124 to be pulled by the internal fan to the outside of the rack assembly 102. The side of the frame 310 holds an EMI spring 314. The fan module 135 includes a top fin 322 and a fan door push key 324 that project backward from the front frame 310 and assist in aligning the fan module 135 in the bay 242 of the operation sled 124. A fan handle 326 is attached to the front frame 310 under the grill 312 to allow a user to pull out the fan module 135 from the operation sled once the locking lever 246 is released.

The fan module 135 includes a fan mounting assembly 330 that holds the fan motor and attached fan located near the front frame 310. The fan mounting assembly 330 is held between the front frame 310 and a back fan guard 332. The back of the fan module 135 includes power connections and control connections that allow a controller on either the rack assembly 102 or the operation sled, to control and monitor the operation of the speed of the fan of the module 135. In this example, the height, width and depth of the front frame 310, the fan mounting assembly 330, and the back fan guard allow the fan module 135 to be mated with either of the mounting bays 240 or 242 of the operation sled 124 in this example.

The modular nature of the fan modules 132, 134, 135, 136, 137, 138 and 139 allows any of the fan modules 132, 134, 135, 136, 137, 138 and 139 to be swapped out while the other fan modules continue to operate. This enables the hardware components in the operation sleds, as well as the rack assembly 102 to be cooled and thus continue to operate. For example, the fan module 136 is shown in FIG. 3 as separated from the operation sled 126 that is still mounted in the rack assembly 102. The fan module 136 therefore may be replaced while the components of the operation sled 126 are still powered and operational as the cooling may be performed by the other fan module 137. Thus, the failure of a single fan module does not require the entire network device 100 or even individual sleds to stop operation and be powered down to replace a fan module.

Further, the modular nature of the fan modules 132, 134, 135, 136, 137, 138 and 139 allows an entire operation sled to be removed for replacement or maintenance while allowing the other operation sleds to operate. As shown in FIG. 3, the operation sled 124 may be removed from the rack assembly 102 by loosening the locking pin 222 and pulling the operation sled 124 away from the rack assembly 102. Once removed from the rack assembly 102, the circuit boards in the operation sled 124 may be replaced when the fan modules, such as the fan modules 134 and 135 are removed from the operation sled 124. After a circuit board or boards are replaced or repaired, the fan modules 134 and 135 may be replaced, and the operation sled 124 may be inserted back into the rack assembly 102. Alternatively, the entire operation sled 124 may be replaced with another operation sled. Since the fan modules 134 and 135 are removable and are modular, these units may be reused with other operation sleds, even if the components of the operation sled 124 fail.

Since the remaining fan modules are kept installed on their respective operation sleds 122, 126 and 128, when the operation sled 124 is removed, they remain operational and cool the components of the operation sleds as well as those components in the rack assembly 102. Thus, the hardware components of the other sleds may remain operational while one or more of the other sleds are removed. Although the above example relates to a network device 100, it is to be understood that the modular fan design may be used with any type of modular device for different electronic components mounted in operation sleds similar to those shown in FIGS. 3-4 and 4 that are inserted in the network device 100 in FIGS. 2-3.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

Computing devices typically include a variety of media, which can include computer-readable storage media and/or communications media, in which these two terms are used herein differently from one another as follows. Computer-readable storage media can be any available storage media that can be accessed by the computer, is typically of a non-transitory nature, and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

The terminology used herein is for the purpose of describing particular embodiments only, and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore terms, such as those defined in commonly used dictionaries, should be interpreted as having a meaning that is consistent with their meaning in the context of the relevant art and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A network device, comprising:
   a rack assembly having side walls forming an enclosure, with a plurality of sled slots accessible from a rear end;
   a plurality of operation sleds, each of the operation sleds being mountable on one of the plurality of sled slots; and
   a plurality of removable fan modules, each of the removable fan modules comprising a handle and being installed in one of the operation sleds, each of the operation sleds including a lock lever being actuated between a first position and a second position and located at a side of corresponding operation sled,
      wherein, while in the first position, a corresponding removable fan module is released from a respective operation sled, and
      wherein, while in the second position, the corresponding removable fan module is held within the respective operation sled.

2. The network device of claim 1, wherein each of the operation sleds includes multiple removable fan modules.

3. The network device of claim 1, wherein each of the operation sleds includes a pair of side walls, a front section and a rear section, wherein the rear section interfaces with the front assembly, and the front section includes a mounting bay for holding one of the removable fan modules.

4. The network device of claim 3,
   wherein, while the lock lever is actuated in the first position, the corresponding removable fan module is released from the mounting bay of the respective operation sled, and
   wherein, while the lock lever is actuated in the second position, the corresponding removable fan module is held within the mounting bay of the respective operation sled.

5. The network device of claim 1, wherein the removable fan module includes a fan and a fan motor.

6. The network device of claim 1, further comprising a front assembly attached to the side wall opposite the rear end, the front assembly including electronic components.

7. The network device of claim 6, wherein the electronic components of the front assembly include line cards and fabric cards, and wherein the device is a network switch.

8. An operation sled that is removable from an assembly rack of a network device, the operation sled comprising:
   a casing including side walls defining a front section and a rear section;
   a circuit board in the rear section;
   a fan mounting bay in the front section; and
   a removable fan module inserted in the fan mounting bay, the removable fan module including a motor, a handle, and a fan,
      wherein the operation sled includes a lock lever being actuated between a first position and a second position and located at a side of corresponding operation sled,
      wherein, while in the first position, the removable fan module is released from a respective operation sled, and wherein, while in the second position, the removable fan module is held within the respective operation sled.

9. The operation sled of claim 8, further comprising:
another fan mounting bay in the front section; and
another removable fan module inserted in the another fan mounting bay.

10. The operation sled of claim 9, wherein the fan mounting bay and another fan mounting bay are adjacent to each other in the front section.

11. The operation sled of claim 8,
wherein, while the lock lever is actuated in the first position, the corresponding removable fan module is released from the mounting bay of the respective operation sled, and
wherein, while the lock lever is actuated in the second position, the corresponding removable fan module is held within the mounting bay of the respective operation sled.

12. The operation sled of claim 8, further comprising a mounting component that interfaces with the rack assembly of the network device to guide the insertion of the operation sled in the rack assembly.

13. A modular device for different electronic components, comprising:
a rack assembly having side walls and a front panel forming an enclosure, with a plurality of sled slots accessible from a rear end opposite the front panel;
a plurality of operation sleds, each of the operation sleds being mountable on one of the plurality of sled slots; and
a plurality of removable fan modules, each of the removable fan modules comprising a handle and being installed in one of the operation sleds, each of the operation sleds including a lock lever being actuated between a first position and a second position and located at a side of corresponding operation sled,
wherein, while in the first position, a corresponding removable fan module is released from a respective operation sled, and
wherein, while in the second position, the corresponding removable fan module is held within the respective operation sled.

* * * * *